United States Patent
Morita et al.

(10) Patent No.: US 9,040,935 B2
(45) Date of Patent: May 26, 2015

(54) BLANKING APPARATUS, DRAWING APPARATUS, AND METHOD OF MANUFACTURING ARTICLE

(71) Applicant: CANON KABUSHIKI KAISHA, Tokyo (JP)

(72) Inventors: Tomoyuki Morita, Utsunomiya (JP); Masato Muraki, Inagi (JP)

(73) Assignee: CANON KABUSHIKI KAISHA (JP)

( * ) Notice: Subject to any disclaimer, the term of this patent is extended or adjusted under 35 U.S.C. 154(b) by 0 days.

(21) Appl. No.: 14/312,953

(22) Filed: Jun. 24, 2014

(65) Prior Publication Data
US 2015/0001417 A1 Jan. 1, 2015

(30) Foreign Application Priority Data
Jun. 26, 2013 (JP) ................................ 2013-134212

(51) Int. Cl.
| | |
|---|---|
| G21K 1/08 | (2006.01) |
| H01J 3/14 | (2006.01) |
| H01J 3/26 | (2006.01) |
| H01J 49/42 | (2006.01) |
| H01J 37/04 | (2006.01) |
| H01J 37/30 | (2006.01) |
| H01J 37/317 | (2006.01) |

(52) U.S. Cl.
CPC ........... *H01J 37/045* (2013.01); *H01J 37/3007* (2013.01); *H01J 37/3177* (2013.01)

(58) Field of Classification Search
CPC ........................................................ H01J 37/04
USPC ................... 250/492.2, 492.1, 396 R, 492.22
See application file for complete search history.

(56) References Cited

U.S. PATENT DOCUMENTS

| | | | |
|---|---|---|---|
| 6,897,458 B2 * | 5/2005 | Wieland et al. ............ | 250/494.1 |
| 7,276,714 B2 | 10/2007 | Platzgummer et al. | |
| 7,816,655 B1 | 10/2010 | Hess et al. | |
| 2010/0038554 A1 * | 2/2010 | Platzgummer et al. ....... | 250/397 |

FOREIGN PATENT DOCUMENTS

JP 4858745 B2 1/2012

* cited by examiner

*Primary Examiner* — David Porta
*Assistant Examiner* — Meenakshi Sahu
(74) *Attorney, Agent, or Firm* — Rossi, Kimms & McDowell LLP

(57) ABSTRACT

The present invention provides a blanking apparatus comprising a plurality of blankers configured to respectively blank a plurality of beams with respect to a target position on an object, and a driving device configured to drive the plurality of blankers, wherein the driving device includes a change device configured to change relation between a combination of beams of the plurality of beams, and a target dose.

11 Claims, 6 Drawing Sheets

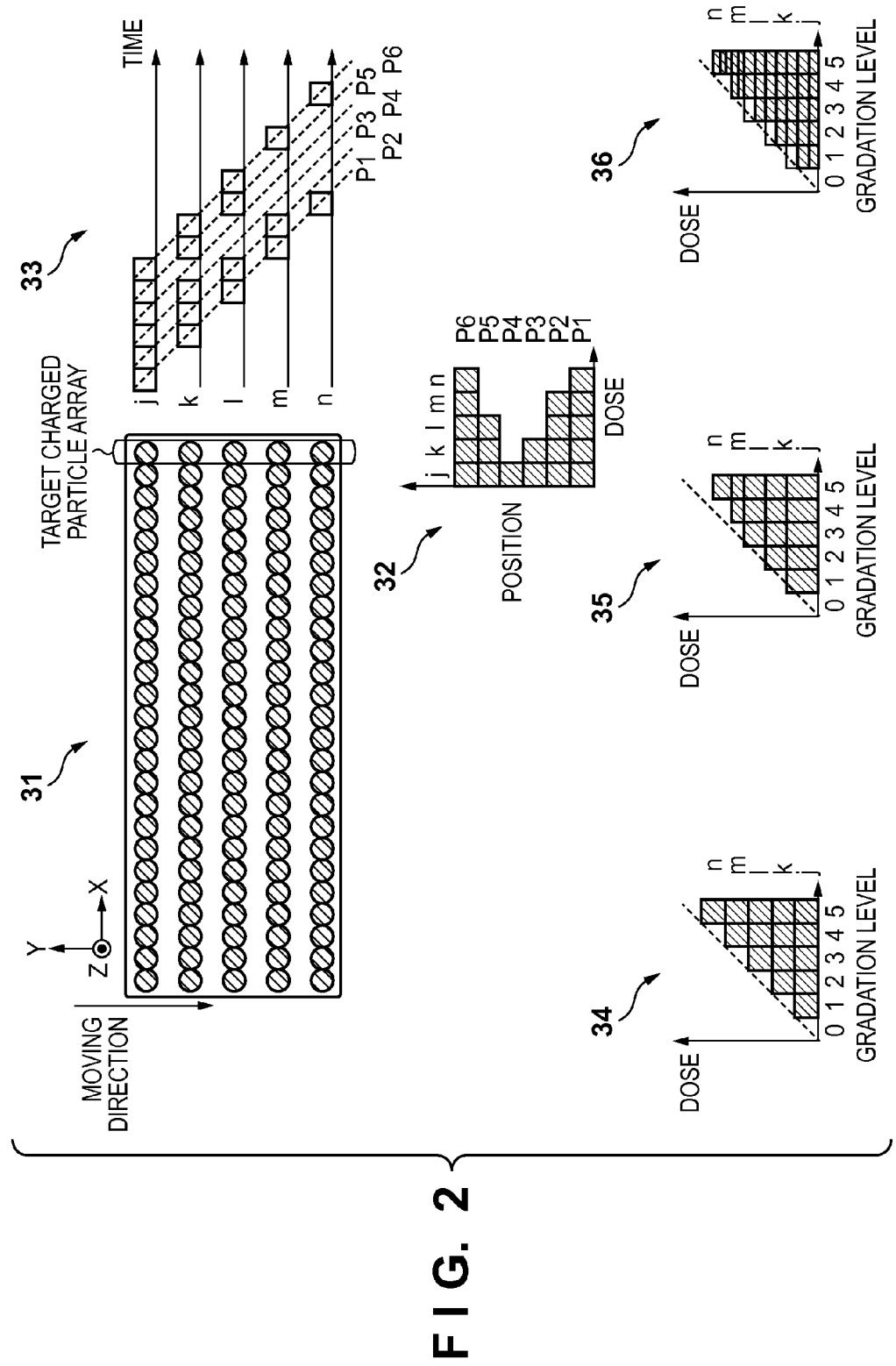
F I G. 2

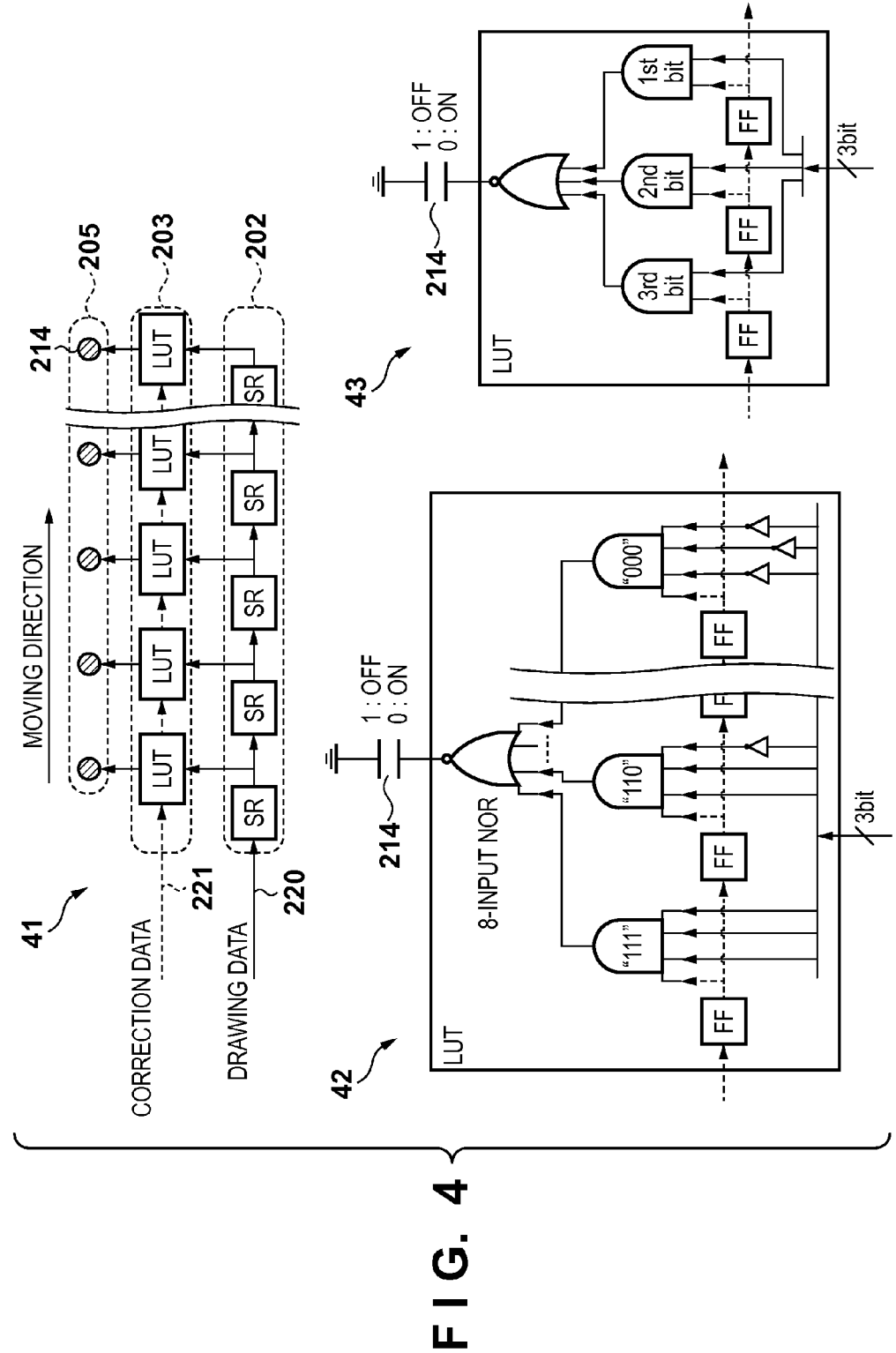
F I G. 4

BLANKING APPARATUS, DRAWING APPARATUS, AND METHOD OF MANUFACTURING ARTICLE

BACKGROUND OF THE INVENTION

1. Field of the Invention

The present invention relates to a blanking apparatus, a drawing apparatus, and a method of manufacturing an article.

2. Description of the Related Art

A drawing apparatus which performs drawing on a substrate by using a plurality of charged particle beams is known as one apparatus used in a manufacturing process (lithography process) for a semiconductor device, or the like. Along with recent micropatterning of semiconductor devices, the drawing apparatus needs to increase the drawing precision so as to form a pattern at a target position on a substrate at high precision. In particular, the drawing apparatus needs to increase the drawing precision at the edge of a pattern formed on a substrate. For this purpose, it is important to control the doses of charged particles irradiating respective positions on a substrate.

Japanese Patent No. 4858745 has proposed a drawing apparatus which changes the number of charged particle beams multi-irradiating the same position on a substrate, thereby performing gradation control on a charged particle beam dose (to be also referred to as a dose simply) at this position.

Japanese Patent No. 4858745 is premised on that the intensities of a plurality of charged particle beams capable of irradiating the same position on a substrate are uniform. However, the intensities of a plurality of charged particle beams are rarely uniform. In practice, the intensities of a plurality of charged particle beams vary. The variation in the intensities of a plurality of charged particle beams may make it difficult to perform gradation control at high precision on doses of irradiation at respective positions on a substrate.

SUMMARY OF THE INVENTION

The present invention provides, for example, a technique advantageous in terms of control of dose onto an object.

According to one aspect of the present invention, there is provided a blanking apparatus comprising: a plurality of blankers configured to respectively blank a plurality of beams with respect to a target position on an object; and a driving device configured to drive the plurality of blankers, wherein the driving device includes a change device configured to change relation between a combination of beams of the plurality of beams, and a target dose.

Further features of the present invention will become apparent from the following description of exemplary embodiments with reference to the attached drawings.

BRIEF DESCRIPTION OF THE DRAWINGS

FIG. 2 is a view for explaining basic drawing processing in the drawing apparatus;

FIG. 4 is a view showing an example of the arrangement of a blanking deflector in the first embodiment;

DESCRIPTION OF THE EMBODIMENTS

Figure 1:
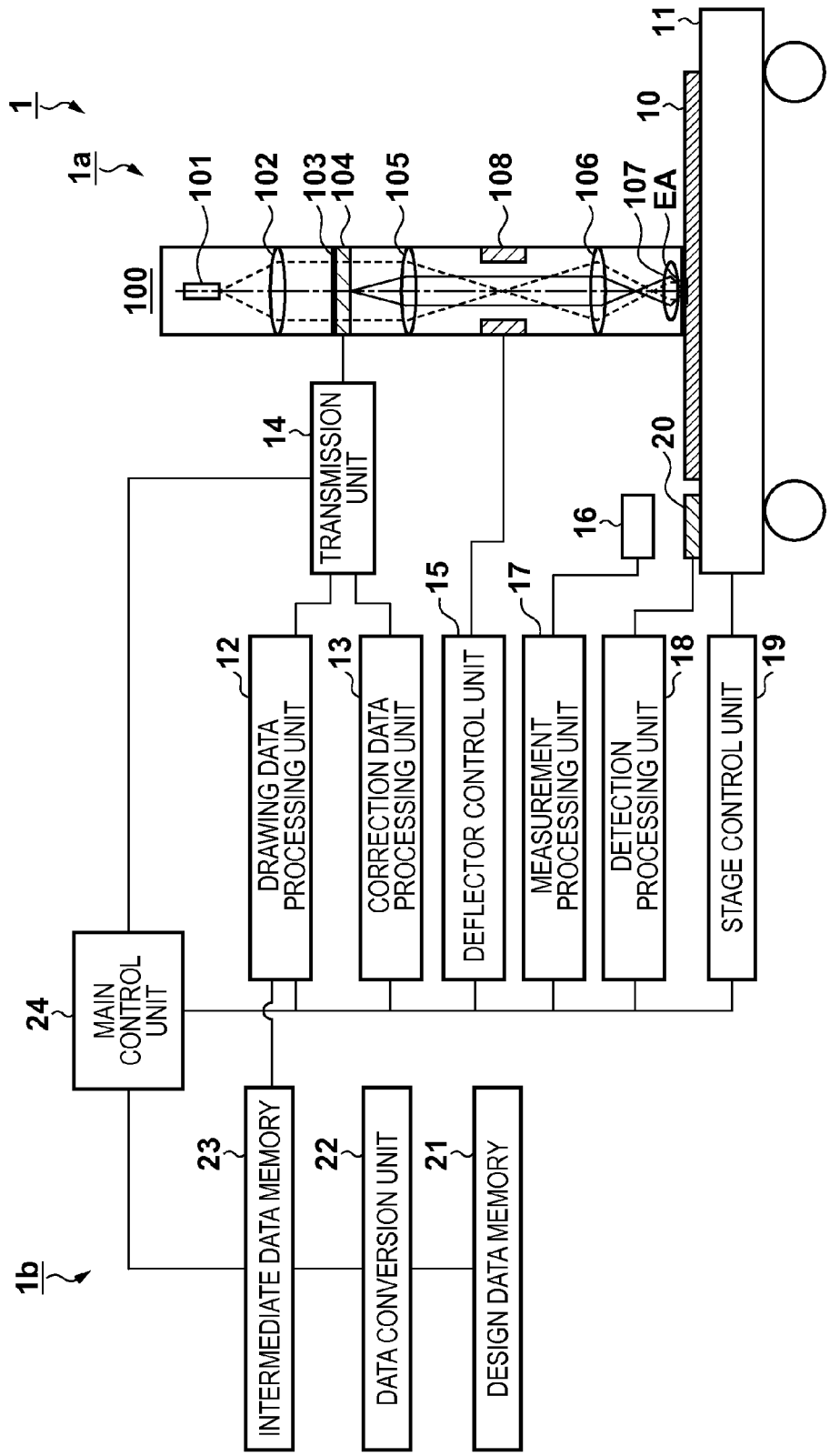
FIG. 1 is a schematic view showing a drawing apparatus according to the present invention.

Exemplary embodiments of the present invention will be described below with reference to the accompanying drawings. Note that the same reference numerals denote the same members throughout the drawings, and a repetitive description thereof will not be given.

Embodiment of Drawing Apparatus

A drawing apparatus 1 according to an embodiment will be explained with reference to FIG. 1. FIG. 1 is a schematic view showing the drawing apparatus 1 according to this embodiment. The drawing apparatus 1 according to this embodiment can be constituted by a drawing system 1a which draws a pattern by irradiating an object (for example, a substrate 10) with a plurality of energy beams (for example, charged particle beams), and a control system 1b which controls the respective units of the drawing system 1a.

First, the drawing system 1a will be explained. The drawing system 1a includes an irradiation unit 100 which irradiates a substrate with a plurality of charged particle beams, and a stage 11 which is movable while holding the substrate 10. The irradiation unit 100 can include, for example, a charged particle source 101, collimator lens 102, aperture array 103, blanking deflector (blanker) 104 (blanking apparatus), electrostatic lens 105, electromagnetic lens 106, objective lens 107, and deflector 108. The charged particle beam is not limited to an electron beam, and may be an ion beam or the like.

As the charged particle source 101, a thermoelectron (thermal electron) emission electron source including an electron emitting material such as $LaB_6$ or BaO/W is used. As the collimator lens 102, for example, an electrostatic lens which condenses a charged particle beam by an electric field is used. The collimator lens 102 collimates a charged particle beam emitted by the charged particle source 101 into a parallel beam, and makes the parallel beam be incident on the aperture array 103. The aperture array 103 has a plurality of two-dimensionally arrayed openings. The aperture array 103 divides the charged particle beam incident as the parallel beam into a plurality of charged particle beams. The plurality of charged particle beams divided by the aperture array 103 are incident on the blanking deflector 104.

The blanking deflector 104 includes a blanker array 204 including a plurality of electrostatic blankers 214 which individually deflect charged particle beams. The blanking deflector 104 controls irradiation of charged particle beams to a region (drawing region EA) to undergo drawing by the drawing system 1a. Each blanker 214 included in the blanker array 204 is formed from two facing electrodes. The blanker 214 can generate an electric field by applying a voltage between the two electrodes, and thus deflect a charged particle beam passing between them. A charged particle beam deflected by the blanking deflector 104 is blocked by a blanking aperture (not shown) arranged on the subsequent stage of the blanking deflector 104, and does not reach the substrate. In contrast, a charged particle beam not deflected by the blanking deflector 104 passes through an opening formed in the blanking aperture and reaches the substrate. That is, the blanking deflector 104 controls blanking of each charged particle beam to switch between irradiation and no irradiation of the substrate 10 with each charged particle beam.

The electrostatic lens 105 and electromagnetic lens 106 form the intermediate images of a plurality of openings in the aperture array in cooperation with each other. The objective lens 107 is an electromagnetic lens, and projects the intermediate images of a plurality of openings on the substrate 10. The deflector 108 deflects, at once in a predetermined direction, a plurality of charged particle beams having passed through the blanking aperture. As a result, the position of the drawing region EA to undergo drawing with a plurality of charged particle beams can be changed.

The stage 11 is configured to be movable while holding the substrate 10. The stage 11 includes, for example, an X-Y stage which is movable in the X-Y plane (horizontal plane) perpendicular to the optical axis of the irradiation unit 100, and an electrostatic chuck for holding (chucking) the substrate 10. A detection unit 20 including an opening pattern through which a charged particle beam is incident is arranged on the stage 11. The detection unit 20 detects the position, shape, and intensity of a charged particle beam.

Next, the control system 1b which controls the respective units of the drawing system 1a will be explained. The control system 1b can include, for example, a drawing data processing unit 12, correction data processing unit 13, transmission unit 14, deflector control unit 15, measurement unit 16, measurement processing unit 17, detection processing unit 18, and stage control unit 19. The control system 1b can also include, for example, a design data memory 21, data conversion unit 22, intermediate data memory 23, and main control unit 24.

The drawing data processing unit 12 includes a buffer memory and data processing circuit. The drawing data processing unit 12 holds intermediate data (to be described later) in the buffer memory, and the data processing circuit generates, from the intermediate data, drawing data for controlling the blanker array 204. Based on information which is supplied from the detection processing unit 18 (to be described later) and represents the position, shape, and intensity of a charged particle beam, the correction data processing unit 13 generates correction data representing a combination of charged particle beams multi-irradiating the substrate 10. The transmission unit 14 transmits the drawing data and correction data to the blanking deflector 104 in accordance with a timing instruction from the main control unit 24. The transmission unit 14 also transmits a clock signal to the blanking deflector 104.

The deflector control unit 15 controls the deflector 108 in accordance with an instruction from the main control unit 24. The measurement unit 16 includes an irradiation system that irradiates a mark (for example, alignment mark) formed on the substrate 10, with light of a wavelength at which the resist is not photosensitive, and an imaging device that images light spectrally reflected by the mark. The measurement unit 16 measures the position of the mark. Based on a signal (measurement result) from the measurement unit 16, the measurement processing unit 17 calculates the actual coordinate value (position) of a shot pattern formed on the substrate 10, and the distortion of the shot pattern. Based on a signal (detection result) from the detection unit 20, the detection processing unit 18 calculates the position, shape, and intensity of each charged particle beam. The stage control unit 19 controls positioning of the stage 11 in cooperation with a laser interferometer (not shown) which measures the position of the stage 11.

The design data memory 21 holds design data (CAD data) which defines a pattern to be drawn on the substrate 10. The data conversion unit 22 divides the design data held in the design data memory 21 for each stripe, and converts it into intermediate data so as to facilitate drawing processing. The stripe is, for example, a region where drawing is performed by a plurality of charged particle beams emitted by the irradiation unit 100 by scanning once the stage 11 in a predetermined direction (for example, Y direction). The intermediate data memory 23 holds the intermediate data converted by the data conversion unit 22. The main control unit 24 includes a CPU and memory. In accordance with a pattern (pattern defined by design data) to be drawn on the substrate 10, the main control unit 24 transfers the intermediate data to the drawing data processing unit 12 (buffer memory). In addition, the main control unit 24 controls the overall (respective units of) drawing apparatus 1 described above. That is, the main control unit 24 controls processing (drawing processing) of drawing a pattern on the substrate 10 by generally controlling the drawing apparatus 1. The control system 1b is constituted by a plurality of units in this embodiment, but is not limited to this and may be configured so that the main control unit 24 has the functions of the plurality of units.

Basic drawing processing in the drawing apparatus 1 will be explained with reference to FIG. 2. In FIG. 2, 31 is a view showing an example of the array of a plurality of charged particle beams which are emitted by the irradiation unit 100 and irradiate the substrate 10. As shown in 31 of FIG. 2, the plurality of charged particle beams irradiating the substrate 10 are arrayed in 5 rows×20 columns. The row pitch indicating the pitch of a charged particle beam in the Y direction is twice larger than the column pitch indicating the pitch of a charged particle beam in the X direction. The moving direction of the stage 11 (substrate 10) is a direction (row direction (−Y direction)) from the upper side to the lower side of the drawing surface, as indicated by an arrow in 31 of FIG. 2.

The drawing apparatus 1 controls whether to irradiate the same position on the substrate with each of a plurality of charged particle beams arrayed in the moving direction of the substrate 10, while continuously moving the substrate stage 11 in the −Y direction. By this control, the drawing apparatus 1 can change the number of charged particle beams multi-irradiating the same position (target position) on the substrate, and can perform gradation control on the dose (charged particle beam dose (dose)) of the charged particle beam at this position. For example, a case will be examined, in which drawing is performed on the substrate 10 so that positions P1 to P6 on the substrate and the doses of charged particle beams at the positions P1 to P6 on the substrate have a relation shown in 32 of FIG. 2 on a target charged particle beam array shown in 31 of FIG. 2. Assume that all charged particle beams irradiate the substrate 10 based on the same clock signal, and the stage 11 is continuously moved in the −Y direction (row direction) at such a speed as to move by the column pitch (half the row pitch) per clock period. j, k, l, m, and n represent rows of the target charged particle beam array.

In this case, when ON/OFF of each of the charged particle beams on the respective rows j to n of the target charged particle beam array per clock period (that is, whether to irradiate the substrate 10 with the charged particle beams) is controlled as shown in 33 of FIG. 2, a relation as shown in 32 of FIG. 2 is obtained. In 33 of FIG. 2, dotted lines indicate times to irradiate the respective positions P1 to P6 on the substrate with the charged particle beams on the respective rows j to n. Squares represent the ON state of the charged particle beams on the respective rows j to n, that is, the state in which the respective positions P1 to P6 on the substrate are irradiated. In 33 of FIG. 2, the times to irradiate the respective positions P1 to P6 on the substrate with the charged particle beams on the respective rows j to n are set by shifting them sequentially by two clock periods. This is because the stage 11 moves by the pitch (row pitch) of the rows j to n of the target charged particle beam array in correspondence with two clock periods.

The relation shown in 32 of FIG. 2 is obtained by adding the doses of the charged particle beams on the rows j to n that multi-irradiate the respective positions P1 to P6 on the substrate. For example, the position P1 is multi-irradiated with five charged particle beams on the rows j to n. The dose of the charged particle beam at the position P1 is obtained by adding the doses of the charged particle beams on the rows j to n. To the contrary, the position P3 is multi-irradiated with two charged particle beams of the rows j and k. The dose of the charged particle beam at the position P3 is obtained by adding the doses of the charged particle beams on the rows j and k. By controlling ON/OFF of the charged particle beams arrayed in the moving direction of the substrate 10 in this manner, the dose of the charged particle beam can be controlled at a gradation level of 0 to 5 at each of the positions P1 to P6 on the substrate. In other words, gradation control on the dose of the charged particle beam cannot be performed before the end of drawing with the charged particle beams arrayed in the row direction. By controlling in the above-described fashion the plurality of charged particle beams arrayed in 5 rows×20 columns, the dose of the charged particle beam can be controlled at the gradation level of 0 to 5 in a stripe region (region divided for each stripe) on the substrate.

Problems when gradation control is performed on the dose of the charged particle beam in the above-described fashion will be explained. In FIG. 2, 34 to 36 show relations between the gradation level of 0 to 5, and the dose of the charged particle beam at the gradation level. In 34 to 36 of FIG. 2, each dotted line indicates the target dose of the charged particle beam with respect to the gradation level.

If the intensities of a plurality of charged particle beams are uniform, the dose of the charged particle beam can be changed linearly in accordance with the gradation level, as shown in 34 of FIG. 2. That is, the dose at each gradation level can become a target dose by only changing the number of charged particle beams multi-irradiating the substrate 10 in accordance with the gradation level. However, the intensities of a plurality of charged particle beams are rarely uniform. In practice, the intensities of a plurality of charged particle beams vary. More specifically, the intensities of at least two charged particle beams out of the plurality of charged particle beams are different. If the intensities of the charged particle beams vary, the doses of the respective charged particle beams differ from each other, as shown in 35 of FIG. 2. The dose of the charged particle beam cannot be changed linearly in accordance with the gradation level. In this case, the dose at each gradation level cannot become a target dose by only changing the number of charged particle beams multi-irradiating the substrate 10 in accordance with the gradation level. Therefore, the drawing apparatus 1 according to this embodiment gives redundancy by increasing the number of charged particle beams (number of rows) arrayed in the moving direction (row direction) of the substrate 10 so as to be larger than the number of gradation levels. Since the number of charged particle beams arrayed in the row direction is increased, the dose at each gradation level can become a target dose by changing the number or combination of charged particle beams used at each gradation level, as shown in 36 of FIG. 2. Hence, gradation control can be performed at high precision on the dose of the charged particle beam at each of a plurality of positions on the substrate.

Figure 3:
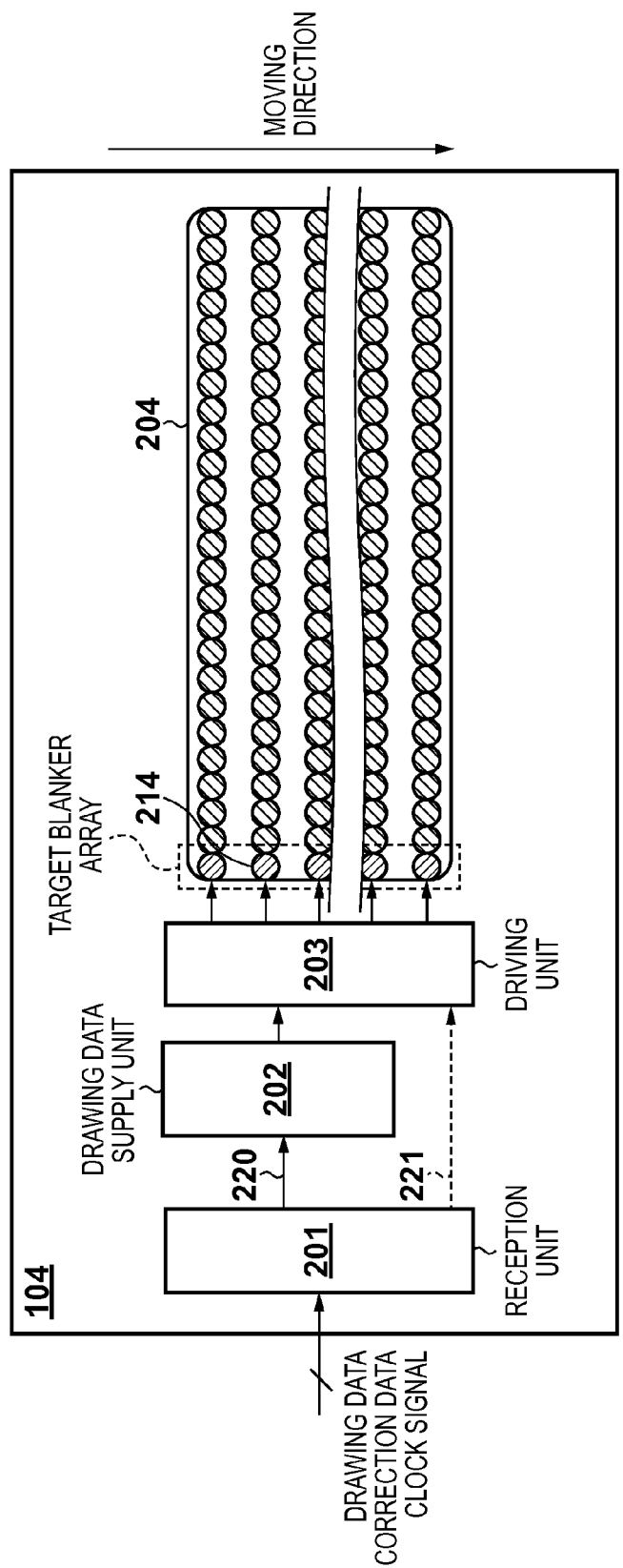
FIG. 3 is a schematic view showing the arrangement of a blanking deflector in the drawing apparatus.

Next, the blanking deflector 104 in the drawing apparatus 1 according to this embodiment will be explained with reference to FIG. 3. FIG. 3 is a schematic view showing the arrangement of the blanking deflector 104 in the drawing apparatus 1 according to this embodiment. The blanking deflector 104 includes the blanker array 204 including the plurality of electrostatic blankers 214 which individually deflect charged particle beams, a reception unit 201, a drawing data supply unit 202, and a driving unit 203. The blanker array 204 includes the plurality of blankers 214 which are arrayed in correspondence with the array of a plurality of charged particle beams irradiating the drawing region EA of the irradiation unit 100. The reception unit 201 receives drawing data, correction data, and a clock signal transmitted from the transmission unit 14, supplies the drawing data to the drawing data supply unit 202 (arrow 220), and supplies the correction data to the driving unit (arrow 221). The drawing data supply unit 202 supplies, to the driving unit 203, the drawing data supplied from the reception unit 201, while shifting (delaying) the drawing data sequentially by two clock periods in synchronism with the movement of the stage 11. The driving unit 203 includes a plurality of flip-flops (FFs (change units)) which change the relationship between the target dose and a combination of charged particle beams to irradiate a target position, out of a plurality of charged particle beams. The driving unit 203 drives each blanker 214 based on the correction data supplied from the reception unit 201 and the drawing data supplied from the drawing data supply unit 202. That is, the driving unit 203 controls ON/OFF of each blanker 214 (whether to deflect a charged particle beam) based on the correction data and drawing data.

The drawing data includes a gradation level represented by a plurality of bits. That is, the drawing data represents, by a plurality of bits, a gradation level corresponding to a target dose requested at a target position on the substrate. The correction data includes information representing the relationship between the gradation level and a combination of charged particle beams to multi-irradiate the substrate 10 in correspondence with the gradation level, out of a plurality of charged particle beams arrayed in the column direction. That is, the correction data includes information representing the relationship between a gradation level and a combination of charged particle beams which achieve a target dose at this gradation level. The correction data is data for determining ON/OFF of each blanker 214 with respect to drawing data supplied to the driving unit 203. The correction data is determined by the correction data processing unit 13 based on the intensity of each charged particle beam detected by the detection unit 20, and set in advance in the driving unit 203. The correction data is updated based on the intensity of each charged particle beam newly detected by the detection unit 20 when, for example, the drawing apparatus 1 is activated. Embodiments of the blanking deflector 104 which controls a target blanker array arrayed in the row direction, as shown in FIG. 3, will be explained. The following embodiments will describe a case in which drawing data is formed from 3 bits and the dose of the charged particle beam is controlled at eight gradation levels. The target blanker array is constituted by 35 blankers 214 larger in number than (eight) gradation levels.

First Embodiment

In the first embodiment, an arrangement in which a plurality of bits representing a gradation level are used when a driving unit 203 controls one blanker 214 will be explained with reference to FIG. 4. In FIG. 4, 41 is a view showing an example of the arrangement of a blanking deflector 104 in the first embodiment.

A drawing data supply unit 202 includes a plurality of 3-bit input/3-bit output shift registers (SRs). Each SR shifts 3-bit drawing data supplied from a reception unit 201 by two clock periods based on a clock signal supplied together, and supplies the drawing data to an adjacent SR and the lookup table (LUT (driving circuit)) of the driving unit 203. The driving unit 203 includes a plurality of LUTs configured to control ON/OFF of one blanker 214. Each LUT is a 3-bit input/1-bit output LUT which outputs a 1-bit signal (driving signal) for controlling ON/OFF of a corresponding blanker 214 in accordance with 3-bit drawing data supplied from the SR.

In FIG. 4, 42 is a view showing an example of the arrangement of the LUT and the blanker 214 corresponding to it. As described above, the blanker 214 is formed from two facing electrodes. One electrode is grounded (GND), and the other electrode is connected to the output terminal of the LUT. When a signal output from the LUT is "1", a voltage is applied between the two electrodes to form an electric field between the electrodes. A charged particle beam passing between the electrodes is deflected and blocked by a blanking aperture. In this case, the charged particle beam does not irradiate a substrate 10 and becomes the OFF state. In contrast, when a signal output from the LUT is "0", no voltage is applied between the two electrodes, and a charged particle beam passing between the electrodes passes through the opening of the blanking aperture and reaches the substrate. In this case, the charged particle beam irradiates the substrate 10 and becomes the ON state.

Each LUT shown in 42 of FIG. 4 includes AND gates and flip-flops (FFs) equal in number to gradation levels. In each LUT, part of correction data supplied from the reception unit 201 that corresponds to this LUT is set in the FFs. That is, in the FFs of the LUT, a signal (which of the ON and OFF states is set for a charged particle beam) to be supplied to the blanker 214 is set for each of the eight gradation levels designated by 3-bit drawing data. By constituting each LUT in this way, a combination of charged particle beams corresponding to each gradation level representing the target dose of the charged particle beam can be determined based on correction data from a plurality of charged particle beams controlled by a target blanker array. Part of the correction data set in each LUT is formed from eight bits (number of gradation levels=$2^3$). When the target blanker array includes 35 blankers, 280 bits are necessary in the entire driving unit 203 (entire correction data).

A method of controlling the blanker 214 based on drawing data and correction data when the LUT is configured as shown in 42 of FIG. 4 will be explained. For example, a case in which the second gradation level counted from the top of the eight gradation levels is supplied as drawing data to the LUT will be examined. In this case, 3 bits of the drawing data are represented as "110". A target dose at a gradation level represented by the 3 bits "110" is achieved by 30 charged particle beams when the intensities of respective charged particle beams are equal. However, assume that the result of detecting the intensities of respective charged particle beams reveals that the target dose is achieved by, for example, a combination of 29 specific charged particle beams out of the plurality of (35) charged particle beams controlled by a target blanker array. At this time, in LUTs corresponding to the 29 specific charged particle beams, "x1xxxxxx" are set as part of the correction data in eight FFs. When the drawing data "110" is input, "1" can be output from the second AND gate (AND gate illustrated with "110") counted from the left out of the eight AND gates in the LUT shown in 42 of FIG. 4. That is, "0" can be output from an 8-input NOR gate, and the charged particle beam can be changed to the ON state. In the above-mentioned correction data, "x"s are values corresponding to the remaining seven AND gates, respectively, and "0" or "1" is set based on a combination of charged particle beams corresponding to the gradation level.

In LUTs corresponding to the remaining six specific charged particle beams, "x0xxxxxx" are set as part of the correction data in eight FFs. When the drawing data "110" is input, "0" can be output from the second AND gate (AND gate illustrated with "110") counted from the left. Also, "0"s are output from the remaining seven AND gates, so "1" can be output from the 8-input NOR gate, and the charged particle beam can be changed to the OFF state. For the remaining gradation levels ("111" and "101" to "000"), part of correction data is similarly set. That is, part of correction data is set in each FF to output "0" from an LUT corresponding to a specific charged particle beam in accordance with a combination of specific charged particle beams determined to obtain the target dose of each gradation level.

Another example of the arrangement of the LUT will be explained with reference to 43 of FIG. 4. In FIG. 4, 43 is a view showing an example of the arrangement of the LUT and the blanker 214 corresponding to it. The LUT shown in 42 of FIG. 4 includes AND gates equal in number to gradation levels, whereas the LUT shown in 43 of FIG. 4 includes AND gates equal in number to the bits of drawing data.

In the LUT, part of correction data supplied from the reception unit 201 that corresponds to the LUT is set in the FFs. That is, in the FFs of the LUT, a signal (which of the ON and OFF states is set for a charged particle beam) to be supplied to the blanker 214 is set for the digit position of each bit of 3-bit drawing data. By constituting each LUT in this fashion, a combination of charged particle beams corresponding to the weight of the digit position of a bit in the drawing data can be determined based on correction data from a plurality of charged particle beams controlled by a target blanker array. Part of the correction data set in each LUT is formed from three bits (number of bits of drawing data=3). When the target blanker array includes 35 blankers, 105 bits are necessary in the entire driving unit 203 (entire correction data). The LUT shown in 43 of FIG. 4 can reduce the circuit scale, compared to the LUT shown in 42 of FIG. 4.

A method of controlling the blanker 214 based on drawing data and correction data when the LUT is configured as shown in 43 of FIG. 4 will be explained. For example, a plurality of blankers 214 included in the target blanker array are assigned in accordance with the weight of the digit position of a bit in the drawing data. For example, five blankers are assigned to the first bit out of three bits, 10 blankers are assigned to the second bit, and 20 blankers are assigned to the third bit. For example, a case in which the first gradation level counted from the top of the eight gradation levels is supplied as drawing data to the LUT will be examined. In this case, 3 bits of the drawing data are represented as "111". A target dose at a gradation level represented by the 3 bits "111" is achieved by 35 charged particle beams controlled by a target blanker array when the intensities of respective particle beams are equal.

However, assume that the result of detecting the intensities of respective charged particle beams reveals that the target dose is achieved by four specific charged particle beams corresponding to the first bit, 10 specific charged particle beams corresponding to the second bit, and 19 specific charged particle beams corresponding to the third bit. At this time, in LUTs corresponding to the four specific charged particle beams, "001" are set as part of the correction data in three FFs. When the drawing data "111" is input to the LUT, "1" can be output from the right AND gate (AND gate of the first bit) out of three AND gates in the LUT shown in 43 of FIG. 4. That is, "0" can be output from a 3-input NOR gate, and the charged particle beam can be changed to the ON state.

In LUTs corresponding to the 10 specific charged particle beams, "010" are set as part of the correction data in three FFs. When the drawing data "111" is input to each of these LUTs, "1" can be output from the center AND gate (AND gate of the second bit) out of the three AND gates in the LUT shown in 43 of FIG. 4. That is, "0" can be output from the 3-input NOR gate, and the charged particle beam can be changed to the ON state. Similarly, in LUTs (LUTs corresponding to the third group) corresponding to 19 specific charged particle beams, "100" are set as part of the correction data in three FFs. When the drawing data "111" is input to each of these LUTs, "1" can be output from the left AND gate (AND gate of the third bit) out of the three AND gates in the LUT shown in 43 of FIG. 4. That is, "0" can be output from the 3-input NOR gate, and the charged particle beam can be changed to the ON state.

To the contrary, in LUTs corresponding to the remaining two specific charged particle beams, "000" are set as part of the correction data in three FFs. When the drawing data "111" is input, "1" can be output from the 3-input NOR gate, and the charged particle beam can be changed to the OFF state. By constituting the blanking deflector 104 in this manner, gradation control can be performed at high precision on the dose of the charged particle beam even if the intensities of charged particle beams vary. When assigning the plurality of blankers 214 in accordance with the digit position of a bit, the assigning may be performed so that the same blanker is not assigned at respective bits. That is, setting of two or more "1"s out of three bits as part of correction data, such as "011", may be avoided. This is because, if the same blanker 214 is assigned at respective bits, the sum of doses of a plurality of charged particle beams does not become a dose corresponding to the weight of the digit position of a bit.

Second Embodiment

Figure 5:
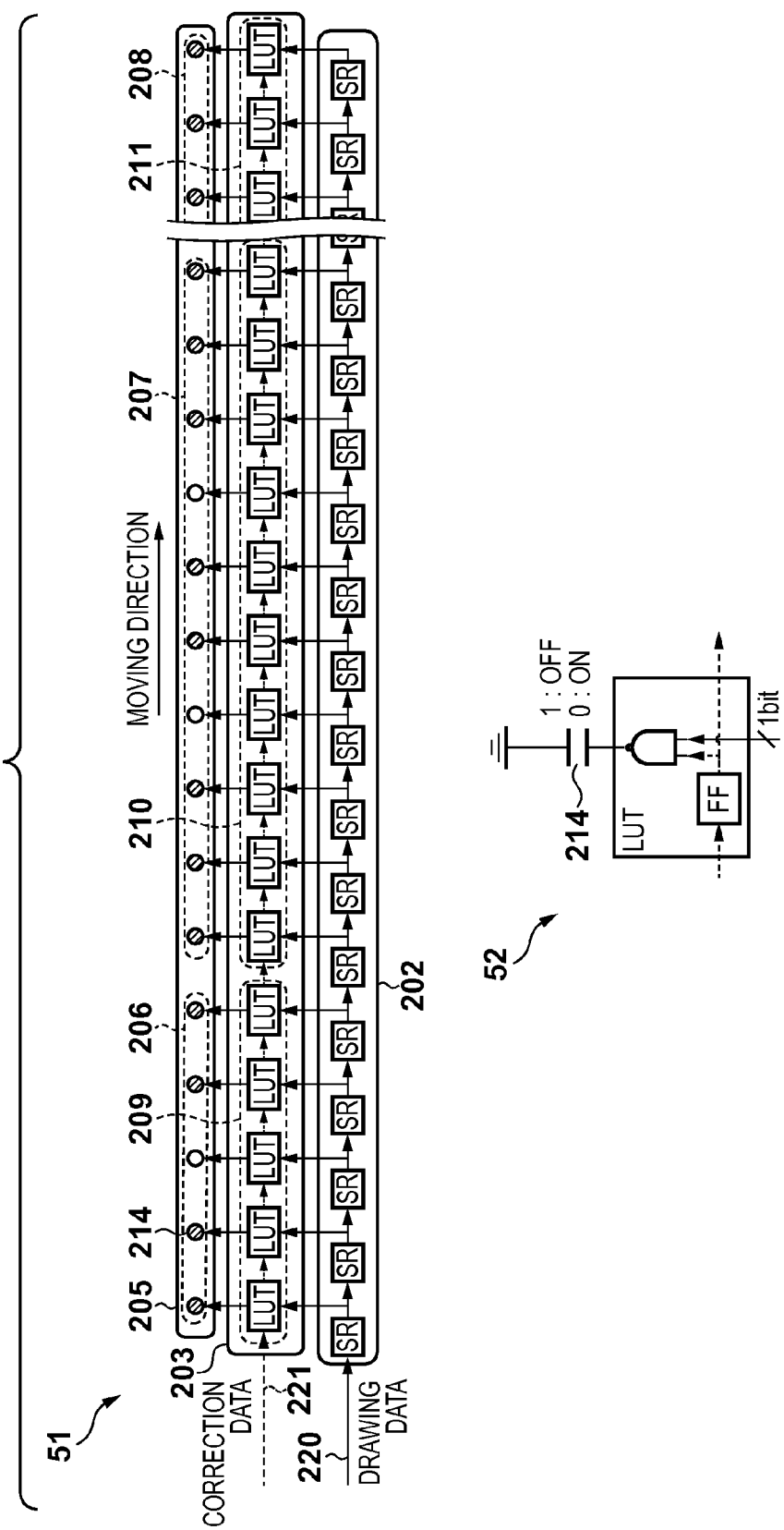
FIG. 5 is a view showing an example of the arrangement of a blanking deflector in the second embodiment.

In the second embodiment, an arrangement in which one of a plurality of bits representing a gradation level is used when a driving unit 203 controls one blanker will be explained with reference to FIG. 5. In FIG. 5, 51 is a view showing an example of the arrangement of a blanking deflector 104 in the second embodiment. In the second embodiment, a plurality of blankers 214 included in a target blanker array are grouped in advance in accordance with the weight of the digit position of a bit in drawing data (3 bits). For example, a group 206 corresponding to the first bit out of the 3 bits includes five blankers 214 in accordance with the weight of the digit position of the first bit. A group 207 corresponding to the second bit out of the 3 bits includes 10 blankers 214 in accordance with the weight of the digit position of the second bit. A group 208 corresponding to the third bit out of the 3 bits includes 20 blankers 214 in accordance with the weight of the digit position of the third bit. In this way, the number of blankers 214 included in each group can be distributed in accordance with the digit position of a bit corresponding to each group, out of a plurality of bits included in drawing data. Each group is configured to include the successively arrayed blankers 214 in 51 of FIG. 5, but may be configured to include the discretely arrayed blankers 214.

A drawing data supply unit 202 includes a plurality of 3-bit input/3-bit output shift registers (SRs). Each SR shifts 3-bit drawing data supplied from a reception unit 201 by two clock periods based on a clock signal supplied together, and supplies the drawing data to an adjacent SR. At this time, the SR supplies a signal of 1 bit out of the 3 bits of the drawing data to each LUT of the driving unit 203 to correspond to the group of the blankers 214 controlled based on this LUT. The driving unit 203 includes a plurality of LUTs configured to control ON/OFF of one blanker. The plurality of LUTs are distributed to three groups 209 to 211 to correspond to the respective groups of the blankers 214. Each LUT is a 1-bit input/1-bit output LUT which outputs a 1-bit signal (driving signal) for controlling ON/OFF of a corresponding blanker 214 in accordance with a 1-bit signal supplied from the SR.

In FIG. 5, 52 is a view showing an example of the arrangement of the LUT and the blanker 214 corresponding to it. In the second embodiment, correction data includes, for each group, the relationship between a bit of drawing data, and a combination of charged particle beams to multi-irradiate a substrate 10, out of a plurality of charged particle beams controllable by a group of the blankers 214 that corresponds to this bit. In the LUT, part of correction data supplied from the reception unit 201 that corresponds to the LUT is set in the FF. That is, in the FF of the LUT, a signal (which of the ON and OFF states is set for a charged particle beam) to be supplied to the blanker 214 is set in accordance with a 1-bit signal supplied from the SR. By constituting each LUT in this manner, a combination of charged particle beams corresponding to the weight of the digit position of a bit in drawing data can be determined based on correction data from a plurality of charged particle beams controlled by a target blanker array. In the second embodiment, part of the correction data set in each LUT is formed from 1 bit. When the target blanker array includes 35 blankers, 35 bits are necessary in the entire driving unit 203 (entire correction data). That is, the LUT shown in 52 of FIG. 5 can be implemented by a simpler circuit arrangement, compared to the LUTs shown in 42 and 43 of FIG. 4, and thus the circuit scale can be reduced.

A method of controlling the blanker 214 based on drawing data and correction data when the LUT is configured as shown in 52 of FIG. 5 will be explained. As described above, the plurality of blankers 214 included in the target blanker array are grouped in advance in accordance with the weight of the digit position of a bit in drawing data. Also, the plurality of LUTs in the driving unit 203 are grouped in accordance with the respective groups of the blankers 214. For example, assume that the result of detecting the intensities of respective charged particle beams reveals that a target dose equivalent to the weight of the first bit in the 3-bit drawing data is achieved by four specific charged particle beams out of five charged particle beams controlled by the group 206. Also, assume that the four specific charged particle beams are controlled by four blankers 214 except for a blanker 214 indicated by an open circle in the group 206, as shown in 51 of FIG. 5. At this time, in five LUTs in the group 209 of the driving unit 203, "11011" are set as part of the correction data in the FFs. In the LUTs corresponding to the four blankers in the group 209, when the first bit of the drawing data is "1", "0" can be output from a NAND gate and the charged particle beam can be changed to the ON state.

Also, assume that the result of detecting the intensities of respective charged particle beams reveals that a target dose equivalent to the weight of the second bit in the 3-bit drawing data is achieved by eight specific charged particle beams out of 10 charged particle beams controlled by the group 207. Also, assume that the eight specific charged particle beams are controlled by eight blankers 214 except for blankers 214 indicated by open circuits in the group 207, as shown in 51 of FIG. 5. At this time, in 10 LUTs in the group 210 of the driving unit 203, "1110101 0111" are set as part of the correction data in the FFs. In the LUTs corresponding to the eight blankers 214 in the group 210, when the second bit of the drawing data is "1", "0" can be output from the NAND gate and the charged particle beam can be changed to the ON state. By processing even the third bit of the drawing data similarly to the first and second bits, the blankers 214 of the group 208 can be controlled. By constituting the blanking deflector 104 in this manner, gradation control can be performed at high precision on the dose of the charged particle beam even if the intensities of charged particle beams vary. In addition, the circuit scale can be reduced in comparison with the blanking deflector 104 shown in FIG. 4.

Third Embodiment

Figure 6:
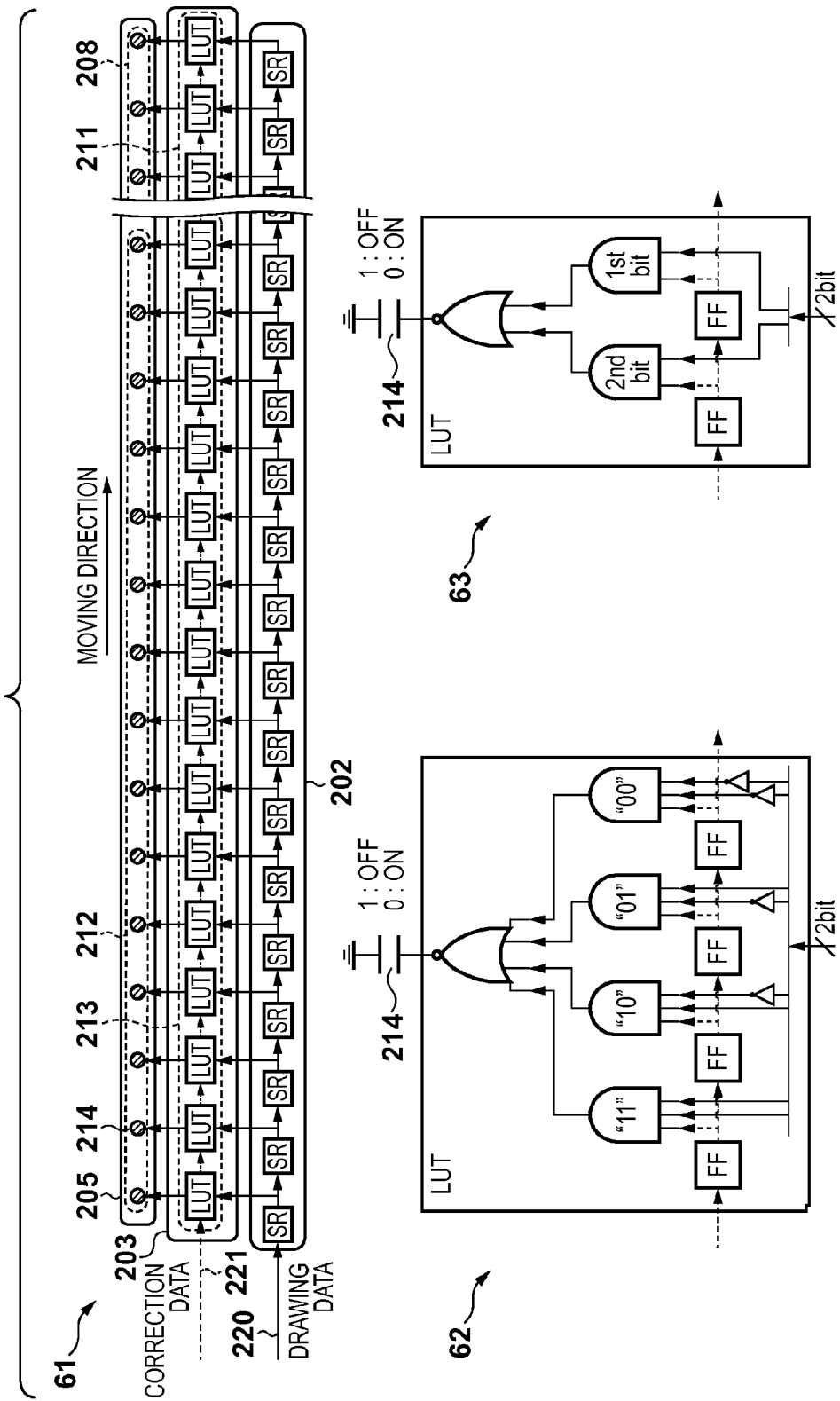
FIG. 6 is a view showing an example of the arrangement of a blanking deflector in the third embodiment.

In the third embodiment, an arrangement in which lower 2 bits or upper 1 bit out of a plurality of bits representing a gradation level is used when a driving unit 203 controls one blanker will be explained with reference to FIG. 6. In FIG. 6, 61 is a view showing an example of the arrangement of a blanking deflector 104 in the third embodiment. The third embodiment is different from the second embodiment in grouping of a plurality of blankers 214 included in a target blanker array, and also different in the arrangement of an LUT in the driving unit 203.

In the third embodiment, the plurality of blankers 214 included in the target blanker array are distributed to a group 212 corresponding to lower 2 bits (first and second bits) of drawing data (3 bits), and a group 208 corresponding to upper 1 bit (third bit). For example, the group 212 corresponding to lower 2 bits out of the 3 bits of the drawing data includes 15 blankers 214 in accordance with the weights of the positions of the first and second bits. The group 208 corresponding to upper 1 bit out of the 3 bits of the drawing data includes 20 blankers 214 in accordance with the weight of the digit position of the third bit. In this manner, the number of blankers 214 included in each group can be determined in accordance with the digit position of a bit corresponding to this group, out of a plurality of bits included in drawing data. Each group is configured to include the successively arrayed blankers 214 in 61 of FIG. 6, but may be configured to include the discretely arrayed blankers 214.

A drawing data supply unit 202 includes a plurality of 3-bit input/3-bit output shift registers (SRs). Each SR shifts 3-bit drawing data supplied from a reception unit 201 by two clock periods based on a clock signal supplied together, and supplies the drawing data to an adjacent SR. At this time, the SR supplies a signal of lower 2 bits or upper 1 bit out of the 3 bits to each LUT of the driving unit 203 to correspond to the group of the blankers 214 controlled based on this LUT. The driving unit 203 includes a plurality of LUTs configured to control ON/OFF of one blanker. The plurality of LUTs are distributed to two groups 213 and 211 to correspond to the respective groups of the blankers 214. Each LUT in the group 213 is a 2-bit input/1-bit output LUT which outputs a 1-bit signal for controlling ON/OFF of a corresponding blanker 214 in accordance with a signal of lower 2 bits supplied from the SR. In contrast, each LUT in the group 211 is a 1-bit input/1-bit output LUT which outputs a 1-bit signal (driving signal) for controlling ON/OFF of a corresponding blanker 214 in accordance with a signal of upper 1 bit supplied from the SR. The arrangement of the LUT in the group 211 is the same as that of the LUT shown in 52 of FIG. 5, and a description of the LUT in the group 211 will not be repeated. Part of the correction data set in each LUT in the group 211 is formed from 1 bit. Hence, when the target blanker array includes 20 blankers 214, 20 bits are necessary in the entire group 211.

In FIG. 6, 62 is a view showing an example of the arrangement of the LUT in the group 213 and the blanker 214 corresponding to it. In the third embodiment, correction data includes the relationship between upper 1 bit and lower 2 bits of drawing data, and a combination of charged particle beams to multi-irradiate a substrate 10, out of a plurality of charged particle beams controllable by groups of the blankers 214 that correspond to these bits. In the LUT in the group 213, part of correction data supplied from the reception unit 201 that corresponds to the LUT is set in the FFs. That is, in the FFs of the LUT in the group 213, a signal (which of the ON and OFF states is set for a charged particle beam) to be supplied to the blanker 214 is set in accordance with each of four gradation levels designated by lower 2 bits of drawing data supplied from the SR. By constituting each LUT in this way, a combination of charged particle beams corresponding to lower 2 bits of the drawing data can be determined based on correction data from a plurality of charged particle beams controlled by the group 212. Part of the correction data set in each LUT in the group 213 is formed from four bits (number of gradation levels=$2^2$). When the group 212 includes 15 blankers 214, 60 bits are necessary in the entire group 213.

A method of controlling the blanker 214 in the group 212 based on drawing data and correction data when the LUT is configured as shown in 62 of FIG. 6 will be explained. For example, a case in which the second gradation level counted from the top of the four gradation levels in a signal of lower 2 bits out of 3-bit drawing data is supplied to the LUT will be examined. In this case, lower 2 bits are represented as "10". A target dose at a gradation level represented by the 2 bits "10" is achieved by 10 charged particle beams when the intensities of respective charged particle beams are equal. However, assume that the result of detecting the intensities of respective charged particle beams reveals that the target dose is achieved by, for example, a combination of 11 specific charged particle beams out of the plurality of (15) charged particle beams controlled by the group 212. At this time, in LUTs corresponding to the 11 specific charged particle beams, "x1xx" are set as part of the correction data in four FFs. When "10" are input as lower 2 bits of the drawing data, "1" can be output from the second AND gate (AND gate illustrated with "10") counted from the left out of the four AND gates in the LUT shown in 62 of FIG. 6. That is, "0" can be output from a 4-input NOR gate, and the charged particle beam can be changed to the ON state. In the above-mentioned correction data, "x"s are signal values corresponding to the remaining three AND gates, and "0" or "1" is set based on a combination of charged particle beams corresponding to the gradation level.

In LUTs corresponding to the remaining four charged particle beams, "x0xx" are set as part of the correction data in four FFs. When "10" is input as lower 2 bits of the drawing data, "0"s are output from the four AND gates. Thus, "1" can be output from the 4-input NOR gate, and the charged particle beam can be changed to the OFF state. For the remaining gradation levels ("11", "01", and "00"), part of correction data is similarly set. That is, part of correction data is set in each FF to output "0" from an LUT corresponding to a specific charged particle beam in accordance with a combination of specific charged particle beams determined to obtain the target dose of each gradation level.

Another example of the arrangement of the LUT will be explained with reference to 63 of FIG. 6. In FIG. 6, 63 is a view showing an example of the arrangement of the LUT in the group 213 and the blanker 214 corresponding to it. The LUT shown in 62 of FIG. 6 includes AND gates equal in number to gradation levels, whereas the LUT shown in 63 of FIG. 6 includes AND gates equal in number to the bits of a signal supplied to the LUT.

A plurality of (15) blankers included in the group 212 are assigned in accordance with the weight of the digit position of a bit in lower 2 bits of the drawing data supplied to each LUT of the group 213. For example, five blankers are assigned to the first bit out of the lower 2 bits, and 10 blankers are assigned to the second bit out of the lower 2 bits. For example, a case in which the first gradation level counted from the top of the four gradation levels is supplied as lower 2 bits of drawing data to the LUT will be examined. In this case, lower 2 bits of the drawing data supplied to the LUT are represented as "11". Then, assume that a target dose at a gradation level represented by the 2 bits "11" is achieved by four specific charged particle beams corresponding to the first bit and 10 specific charged particle beams corresponding to the second bit. At this time, in LUTs corresponding to the four specific charged particle beams, "01" are set as part of the correction data in two FFs. In LUTs corresponding to the 10 specific charged particle beams, "10" are set as part of the correction data in two FFs. In an LUT corresponding to one remaining charged particle beam, "00" are set as part of the correction data in two FFs. By constituting the blanking deflector 104 in this manner, gradation control can be performed at high precision on the dose of the charged particle beam even if the intensities of charged particle beams vary. When assigning the plurality of blankers 214 in accordance with the digit position of a bit, the assigning may be performed so that the same blanker 214 is not assigned at respective bits. That is, setting of "11" in the FFs of each LUT may be avoided. This is because, if the same blanker 214 is assigned at respective bits, the sum of doses of a plurality of charged particle beams does not become a dose corresponding to the weight of the digit position of a bit.

In this case, the intensities of respective charged particle beams are detected in advance, and a combination (correction data) of charged particle beams corresponding to each gradation level is determined based the detection result. For example, a detection unit 20 detects all charged particle beams when drawing processing is not performed. Based on the detection result, a detection processing unit 18 calculates the intensities of the respective charged particle beams. Based on information representing the intensities of the respective charged particle beams, a correction data processing unit 13 determines, as drawing data for each gradation level, information representing a combination of charged particle beams which achieve a target dose corresponding to the gradation level. Prior to drawing processing, the correction data determined by the correction data processing unit 13 is supplied to the driving unit 203 via a transmission unit 14 and the reception unit 201 of the blanking deflector 104. Part of the correction data supplied to the driving unit 203 is set in each FF of each LUT. The process of determining correction data and supplying it to the driving unit 203 may be executed regularly in a predetermined period when, for example, a drawing apparatus 1 is activated. For descriptive convenience, the embodiment has described a case in which correction data is formed from 3 bits, the number of charged particle beams arrayed in the row direction is 35, and the dose of the charged particle beam is controlled at eight gradation levels. However, the present invention is not limited to this. Gradation control can be performed at higher precision by increasing the number of gradation levels and the number of charged particle beams in the row direction.

<Embodiment of Method of Manufacturing Article>

A method of manufacturing an article according to the embodiment of the present invention is suitable for manufacturing an article such as a microdevice (for example, a semiconductor device) or an element having a microstructure. The method of manufacturing an article according to the embodiment includes a step of forming a latent image pattern on a photosensitive agent applied to a substrate by using the above-described drawing apparatus (a step of performing drawing on a substrate), and a step of developing the substrate on which the latent image pattern has been formed in the preceding step. Further, this manufacturing method includes other well-known steps (for example, oxidization, deposition, vapor deposition, doping, planarization, etching, resist removal, dicing, bonding, and packaging). The method of manufacturing an article according to the embodiment is superior to a conventional method in at least one of the performance, quality, productivity, and production cost of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

For example, in the above description, the blanker array 204 (blanking deflector 104) includes an array of independently drivable electrode pairs. However, the present invention is not limited to this, and the blanker array 204 suffices to be an array of elements having the blanking function. For example, the blanker array can include a reflective electron patterning device as disclosed in U.S. Pat. No. 7,816,655. This device includes a pattern on the top surface, an electron reflecting portion of the pattern, and an electron non-reflecting portion of the pattern. This device further includes an array of circuitry for dynamically changing the electron reflecting portion and electron non-reflecting portion of the pattern by using a plurality of independently controllable pixels. In this manner, the blanker array may be an array of elements (blankers) which perform blanking of a charged particle beam by changing a reflecting portion into an electron non-reflecting portion with respect to a charged particle beam. Needless to say, the arrangement of an irradiation unit including such a reflective device, and that of an irradiation unit including a transparent device such as an electrode pair array may be different from each other.

This application claims the benefit of Japanese Patent Application No. 2013-134212 filed on Jun. 26, 2013, which is hereby incorporated by reference herein in its entirety.

What is claimed is:

1. A blanking apparatus comprising:
   a plurality of blankers configured to respectively and selectively blank a plurality of beams with respect to a target position on an object; and
   a driving device configured to drive the plurality of blankers,
   wherein the driving device includes a change device configured to change a relation between a combination of beams, not to be blanked with respect to the target position, of the plurality of beams, and a target dose.

2. The apparatus according to claim 1, further comprising a controller configured to control the change device based on information representing the relation.

3. The apparatus according to claim 1, wherein
   the driving device includes a plurality of driving circuits respectively corresponding to the plurality of blankers, and
   a driving circuit of the plurality of driving circuits includes information representing a relationship between the target dose and a driving signal to a blanker of the plurality of blankers corresponding to the driving circuit, and is configured to drive the blanker based on the target dose and the relationship.

4. The apparatus according to claim 1, wherein
the target dose is represented by a plurality of bits,
the plurality of blankers are distributed to a plurality of groups such that each of the plurality of groups correspond to at least one bit of the plurality of bits,
numbers of blankers respectively included in the plurality of groups are different from each other in accordance with bit positions of the at least one bit respectively corresponding thereto, and
the change device is configured to change the relation with respect to each of the plurality of groups.

5. The apparatus according to claim 4, wherein
the driving device includes a plurality of driving circuits respectively corresponding to the plurality of blankers, and
a driving circuit of the plurality of driving circuits includes information representing a relationship between the at least one bit and a driving signal to a blanker of the plurality of blankers corresponding to the driving circuit, and is configured to drive the blanker based on the at least one bit and the relationship.

6. The apparatus according to claim 1, wherein number of gradation levels of the target dose is smaller than number of beams in the plurality of beams.

7. A drawing apparatus which performs drawing on a substrate, the apparatus comprising:
an irradiation device configured to irradiate the substrate with a plurality of beams; and
a stage configured to hold the substrate and to be movable,
wherein the irradiation device includes a blanking apparatus comprising:
a plurality of blankers configured to respectively and selectively blank a plurality of beams with respect to a target position on an object; and
a driving device configured to drive the plurality of blankers,
wherein the driving device includes a change device configured to change a relation between a combination of beams, not to be blanked with respect to the target position, of the plurality of beams, and a target dose.

8. The apparatus according to claim 7, further comprising:
a detector configured to detect each of the plurality of beams; and
a controller configured to obtain information representing the relation based on an output from the detector.

9. A method of manufacturing an article, the method comprising steps of:
performing drawing on a substrate using a drawing apparatus;
developing the substrate on which the drawing has been performed; and
processing the developed substrate to manufacture the article,
wherein the drawing apparatus performs drawing on the substrate, and includes:
an irradiation device configured to irradiate the substrate with a plurality of beams; and
a stage configured to hold the substrate and to be movable,
wherein the irradiation device includes a blanking apparatus, the blanking apparatus including:
a plurality of blankers configured to respectively and selectively blank a plurality of beams with respect to a target position on the substrate; and
a driving device configured to drive the plurality of blankers,
wherein the driving device includes a change device configured to change a relation between a combination of beams, not to be blanked with respect to the target position, of the plurality of beams, and a target dose.

10. The apparatus according to claim 1, wherein
a dose at a position on the object is controlled by the combination of beams, which are incident on the position, of the plurality of beams, and
the driving device is configured to drive the plurality of blankers such that the beams determined based on the relation and the target dose are incident on the target position.

11. The apparatus according to claim 2, wherein
the information includes the relation with respect to each of a plurality of doses which are different from each other, and
the controller is configured to cause the change device to change the relation based on the information.

* * * * *